US012621374B2

(12) United States Patent
Yang et al.

(10) Patent No.: US 12,621,374 B2
(45) Date of Patent: May 5, 2026

(54) BATTERY MANAGEMENT SYSTEM AND METHOD FOR TRANSMITTING DATA TO HIGHER-LEVEL SYSTEM

(71) Applicant: LG ENERGY SOLUTION, LTD., Seoul (KR)

(72) Inventors: Seong Yeol Yang, Daejeon (KR); Sang Hoon Lee, Daejeon (KR); Chan Ha Park, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 184 days.

(21) Appl. No.: 17/609,860

(22) PCT Filed: May 21, 2020

(86) PCT No.: PCT/KR2020/006639
§ 371 (c)(1),
(2) Date: Nov. 9, 2021

(87) PCT Pub. No.: WO2020/242131
PCT Pub. Date: Dec. 3, 2020

(65) Prior Publication Data
US 2022/0247841 A1    Aug. 4, 2022

(30) Foreign Application Priority Data

May 28, 2019    (KR) ........................ 10-2019-0062681

(51) Int. Cl.
*G06F 15/16*        (2006.01)
*G01R 31/371*       (2019.01)
(Continued)

(52) U.S. Cl.
CPC ............ *H04L 69/18* (2013.01); *G01R 31/371* (2019.01); *G01R 31/3835* (2019.01); (Continued)

(58) Field of Classification Search
CPC ......... H04L 69/18; H04L 12/40; H04L 69/26; H04L 67/12; H04L 67/125;
(Continued)

(56) References Cited

U.S. PATENT DOCUMENTS 5,515,429 A * 5/1996 Kawada ............. H04Q 11/0428
                                                379/279
8,688,320 B2 * 4/2014 Faenger ................. B60K 35/00
                                                340/500

(Continued)

FOREIGN PATENT DOCUMENTS

EP    2 700 963 A1    2/2014
EP    3 315 347 A1    5/2018
(Continued)

OTHER PUBLICATIONS

International Search Report (PCT/ISA/210) issued in PCT/KR2020/006639 mailed on Aug. 26, 2020.
(Continued)

*Primary Examiner* — Kaylee J Huang
(74) *Attorney, Agent, or Firm* — Birch, Stewart, Kolasch & Birch, LLP

(57)        ABSTRACT

Disclosed is a battery management system (BMS) having a data processing unit for classifying data received in real time from a plurality of slave BMS to be first data if the data is determined to be data to be urgently transmitted based on preset criteria and classifying the received data to be second data if the data is determined not to be urgently transmitted, a first data transmission unit for transmitting the first data to a higher-level system using a first communication protocol, a second data storage unit for storing the second data cumulatively, and a second data communication unit for transmitting the second data stored in the second data storage unit to the higher-level system using a second (Continued)

communication protocol different from the first communication protocol.

16 Claims, 8 Drawing Sheets

(51) Int. Cl.

| | | |
|---|---|---|
| *G01R 31/3835* | (2019.01) | |
| *H04L 12/40* | (2006.01) | |
| *H04L 69/00* | (2022.01) | |
| *H04L 69/18* | (2022.01) | |
| *H04L 67/12* | (2022.01) | |

(52) U.S. Cl.
CPC .............. *H04L 12/40* (2013.01); *H04L 69/26* (2013.01); *H04L 2012/40215* (2013.01); *H04L 67/12* (2013.01)

(58) Field of Classification Search
CPC .... H04L 2012/40215; G01R 31/03835; G01R 31/371; G01R 31/3835
USPC .................................. 709/217, 219, 208, 224
See application file for complete search history.

(56) References Cited

U.S. PATENT DOCUMENTS

| | | | | |
|---|---|---|---|---|
| 11,258,683 | B2 * | 2/2022 | Park | ...................... H04L 43/045 |
| 2004/0007876 | A1 * | 1/2004 | Braun | ....................... H02P 9/04 |
| | | | | 290/1 A |
| 2008/0300005 | A1 * | 12/2008 | Phool | ................... H04W 88/10 |
| | | | | 455/525 |
| 2012/0045988 | A1 * | 2/2012 | Blanton | ................... H04Q 9/00 |
| | | | | 455/39 |
| 2012/0099445 | A1 * | 4/2012 | Matsumoto | ....... H04L 12/40006 |
| | | | | 370/252 |
| 2013/0046495 | A1 | 2/2013 | Sim | |
| 2013/0223545 | A1 * | 8/2013 | Zhang | ................... H04L 1/0015 |
| | | | | 375/259 |
| 2013/0238222 | A1 | 9/2013 | Okamoto | |
| 2013/0335030 | A1 | 12/2013 | Joe et al. | |
| 2013/0337301 | A1 | 12/2013 | Joe et al. | |
| 2013/0346000 | A1 | 12/2013 | Joe et al. | |
| 2014/0152784 | A1 * | 6/2014 | Mccoy | ................. H04N 13/194 |
| | | | | 348/52 |
| 2014/0184234 | A1 | 7/2014 | Okabe | |
| 2014/0215275 | A1 * | 7/2014 | Ghazanfari | ......... G06F 11/3636 |
| | | | | 714/38.1 |
| 2015/0086812 | A1 | 3/2015 | Joe et al. | |
| 2015/0115969 | A1 | 4/2015 | Ishida et al. | |
| 2015/0160077 | A1 * | 6/2015 | Min | ......................... B60L 3/12 |
| | | | | 374/45 |
| 2015/0181643 | A1 * | 6/2015 | Lakdawala | ............. H04L 7/033 |
| | | | | 375/295 |
| 2016/0301231 | A1 | 10/2016 | Cho | |
| 2017/0030950 | A1 * | 2/2017 | Uebel | .................... G01R 22/06 |
| 2017/0170951 | A1 * | 6/2017 | Ito | ........................... H04L 12/40 |
| 2017/0194673 | A1 * | 7/2017 | Jeon | .................... H01M 10/425 |
| 2017/0264560 | A1 * | 9/2017 | Heine | .............. H04L 12/40182 |
| 2017/0276737 | A1 * | 9/2017 | Ham | ...................... G01R 31/50 |
| 2018/0108954 | A1 | 4/2018 | Huang et al. | |
| 2018/0145521 | A1 * | 5/2018 | Hwang | ............... G01R 31/382 |
| 2018/0308652 | A1 * | 10/2018 | Lee | ........................ H01H 71/46 |
| 2018/0325015 | A1 * | 11/2018 | Wolters | ............... G05D 1/0274 |
| 2018/0364284 | A1 | 12/2018 | Kim et al. | |
| 2019/0039458 | A1 | 2/2019 | Ryu | |
| 2019/0347926 | A1 * | 11/2019 | Chokor | .................. G06V 10/40 |

FOREIGN PATENT DOCUMENTS

| | | | |
|---|---|---|---|
| JP | 2013-118757 | A | 6/2013 |
| JP | 2013-192290 | A | 9/2013 |
| JP | 5545309 | B2 | 7/2014 |
| JP | 2016-201977 | A | 12/2016 |
| JP | 6334423 | B2 | 5/2018 |
| JP | 2018-179653 | A | 11/2018 |
| JP | 2019-513339 | A | 5/2019 |
| KR | 10-2013-0116170 | A | 10/2013 |
| KR | 10-1408886 | B1 | 6/2014 |
| KR | 10-1441761 | B1 | 9/2014 |
| KR | 10-2015-0145517 | A | 12/2015 |
| KR | 10-1732482 | B1 | 6/2017 |
| KR | 10-2017-0088530 | A | 8/2017 |
| KR | 10-2018-0079769 | A | 7/2018 |
| KR | 10-2018-0118853 | A | 11/2018 |
| KR | 10-1930160 | A | 12/2018 |
| KR | 10-1974015 | B1 | 5/2019 |

OTHER PUBLICATIONS

Extended European Search Report Application No. 20813629.1 issued on Jul. 4, 2022.

* cited by examiner

START

RECEIVE SECOND DATA INCLUDING TIME STAMP FROM PLURALITY OF SLAVE BMSs ~S600

STORE SECOND DATA ~S602

TRANSMIT SECOND DATA IN BLOCK FORM TO HIGHER-LEVEL SYSTEM BY STREAMING PERIODICALLY OR WHEN THERE IS REQUEST BY HIGHER-LEVEL SYSTEM ~S604

END

710

740

MCU

COMMUNICATION
I/F

720

730

MEMORY

INPUT/OUTPUT
I/F

BATTERY MANAGEMENT SYSTEM AND METHOD FOR TRANSMITTING DATA TO HIGHER-LEVEL SYSTEM

CROSS-REFERENCE TO RELATED APPLICATIONS

This U.S. non-provisional patent application claims priority under 35 U.S.C. § 119 of Korean Patent Application No. 10-2019-0062681, filed on May 28, 2019, the entire contents of which are hereby incorporated by reference.

TECHNICAL FIELD

The present invention relates to a technology for efficiently transmitting data collected from a plurality of slave EMS to a higher-level system.

BACKGROUND ART

Recently, research and development for secondary batteries have been actively conducted. Here, a secondary battery is a battery which may be charged/discharged, and includes all of typical Ni/Cd batteries, Ni/MH batteries, and the like and recent lithium ion batteries. A lithium ion battery among secondary batteries has an advantage in that the energy density thereof is much higher than that of typical Ni/Cd batteries, Ni/MH batteries, and the like. Also, a lithium ion battery may be manufactured small and lightweight, and thus, is used as a power source of mobile devices. In addition, a lithium ion battery has attracted attention as a next generation energy storage medium since the range of use thereof has been expanded to being a power source of electric vehicles.

A secondary battery is generally used as a battery pack including a battery module in which a plurality of battery cells are connected in series and/or in parallel. In addition, the state and operation of a battery pack is managed and controlled by a battery management system.

The plurality of battery modules are connected in serial/parallel to constitute a battery rack, and a plurality of battery racks are connected in parallel to constitute a battery bank. Such a battery bank may be used as an Energy storage system (ESS). Each of the battery modules is monitored and controlled by a corresponding module EMS. A rack BMS, which is the highest-level controller in each battery rack, monitors and controls each module BMS, and monitors and controls the entire battery rack state based on information obtained from the module BMS.

As such, in the case of a BMS system for ESS, the corresponding system includes a configuration for sensing the state of a battery, a configuration for collecting and transferring the state of a battery to a higher-level system, a configuration for transferring the collected battery state information to the higher-level system, and a configuration for displaying the information on a user screen.

Typically, a configuration for collecting the state information of a sensed battery and transferring the state information to a higher-level system in a BMS system for ESS transmits sensing data periodically according to the state of the higher-level system.

However, in this case, there has been a situation in which all the data which may be sensed has not been transmitted in real time due to a problem about the state between the configuration for collecting the state information of a sensed battery and transferring the state information to a higher-level system and the higher-level system. Therefore, it has not been possible to correctly take a log, and accordingly, it has been difficult to correctly analyze the state of a battery.

DISCLOSURE OF THE INVENTION

Technical Problem

A purpose of the present invention is to solve a limitation on a storage method and a transmission method in transmitting and receiving data between a component for collecting state information of a sensed battery and transferring the state information to a higher-level system and the higher-level system.

Technical Solution

According to an embodiment of the present invention, there is provided a Battery Management System (BMS) including a data processing unit for classifying data received in real time from a plurality of slave BMS to be first data if the data is determined to be data to be urgently transmitted based on preset criteria and classifying the received data to be second data if the data is determined not to be urgently transmitted, a first data transmission unit for transmitting the first data to a higher-level system using a first communication protocol, a second data storage unit for storing the second data cumulatively, and a second data communication unit for transmitting the second data stored in the second data storage unit to the higher-level system using a second communication protocol different from the first communication protocol.

In the EMS according to an embodiment of the present invention, the first communication protocol is to transmit the received data in a Controller Area Network (CAN) manner, and the second communication protocol is to transmit the received data in a streaming manner.

In the BMS according to an embodiment of the present invention, the second data is transmitted in a block form using a User Datagram Protocol (UDP) or a Transmission Control Protocol (TCP) on the basis of Ethernet, or a wi-fi.

In the BMS according to an embodiment of the present invention, the second data storage unit stores the second data together with a time stamp which has been received together with the data.

In the BMS according to an embodiment of the present invention, the second data communication unit transmits the second data in a block form to the higher-level system periodically or when a transmission request is received from the higher-level system.

In the EMS according to an embodiment of the present invention, the data processing unit is configured to determine corresponding data to be the data to be urgently transmitted, and classify the received data as first data, if the data received from the slave BMSs is determined to be abnormal data or to be data related to at least one of overvoltage, low voltage, terminal opening, and change in temperature of a battery over a preset value, and classifies the corresponding data as second data, if the data received from the slave BMSs is determined to be data related to at least one of battery cell voltage, temperature or diagnostic data, self-diagnosis result data, and fan state data.

In the BMS according to an embodiment of the present invention, the EMS is a BMS for ESS.

According to another embodiment of the present invention, there is provided a EMS including a digital-to-analog data conversion unit for receiving a digital signal from a plurality of terminals and converting the signal into analog data, a data transmission unit for receiving the analog data from the digital-to-analog data conversion unit and transmitting the data to a higher-level system using a first communication protocol, a second data reception unit for receiving second data from a plurality of slave BMSs, a second data storage unit for storing the second data cumulatively, and a second data communication unit for transmitting the second data stored in the second data storage unit to the higher-level system using a second communication protocol different from the first communication protocol.

In the EMS according to another embodiment of the present invention, the first communication protocol is to transmit the received data in a CAN manner, and the second communication protocol is to transmit the received data in a streaming manner.

In the EMS according to another embodiment of the present invention, the second data is transmitted in a block form using a User Datagram Protocol (UDP) or a Transmission Control Protocol (TCP) on the basis of Ethernet, or a wi-fi.

In the EMS according to another embodiment of the present invention, the second data storage unit stores the second data together with a time stamp which has been received together with the second data.

In the EMS according to another embodiment of the present invention, the second data communication unit transmits the second data in a block form to the higher-level system periodically or when a transmission request is received from the higher-level system.

In the BMS according to another embodiment of the present invention, the first data may be data related to at least one of signal data received directly from a molded case circuit breaker (MCCB) or a protection relay, and signal data received directly from at least one sensor (door opening, overvoltage/overcurrent relay, etc.), and the second data is data related to at least one of battery cell voltage, temperature or diagnostic data, self-diagnosis result data, and fan state data.

In the EMS according to another embodiment of the present invention, the BMS is a BMS for an energy storage system (ESS).

According to yet another embodiment of the present invention, there is provided a method for transmitting data to a higher-level system, wherein the method includes determining whether data received from a slave BMS is data to be urgently transmitted based on preset criteria, determining, if the data is determined to be the data to be urgently transmitted based on preset criteria, the received data to be first data, and transmitting the received data to a higher-level system using a first communication protocol, determining, if the data is determined to be not the data to be urgently transmitted, the received data to be second data, and storing the second data, and transmitting the stored second data to the higher-level system using a second communication protocol.

In the method for transmitting data to a higher-level system according to yet another embodiment of the present invention, the first communication protocol is to transmit the received data in a CAN manner, and the second communication protocol is to transmit the received data in a streaming manner.

In the method for transmitting data to a higher-level system according to yet another embodiment of the present invention, the second data is transmitted in a block form using a User Datagram Protocol (UDP) or a Transmission Control Protocol (TCP) on the basis of Ethernet, or a wi-fi.

In the method for transmitting data to a higher-level system according to yet another embodiment of the present invention, the second data is transmitted in a block form to the higher-level system periodically or when a transmission request is received from the higher-level system.

In the method for transmitting data to a higher-level system according to yet another embodiment of the present invention, when determined to be data to be urgently transmitted based on the preset criteria, the data received from the slave BMS is determined to be abnormal data or data related to at least one of overvoltage, low voltage, terminal opening, and change in temperature of a battery over a preset value.

In the method for transmitting data to a higher-level system according to yet another embodiment of the present invention, the method for transmitting data to a higher-level system is performed by the BMS for an ESS.

Advantageous Effects

According to embodiments of the present invention, in transmitting and receiving data between a component for collecting the state information of a sensed battery and transferring the state information to a higher-level system and the higher-level system, there is an effect of solving a limitation on a storage method and a transmission method.

MODE FOR CARRYING OUT THE INVENTION

Figure 1:
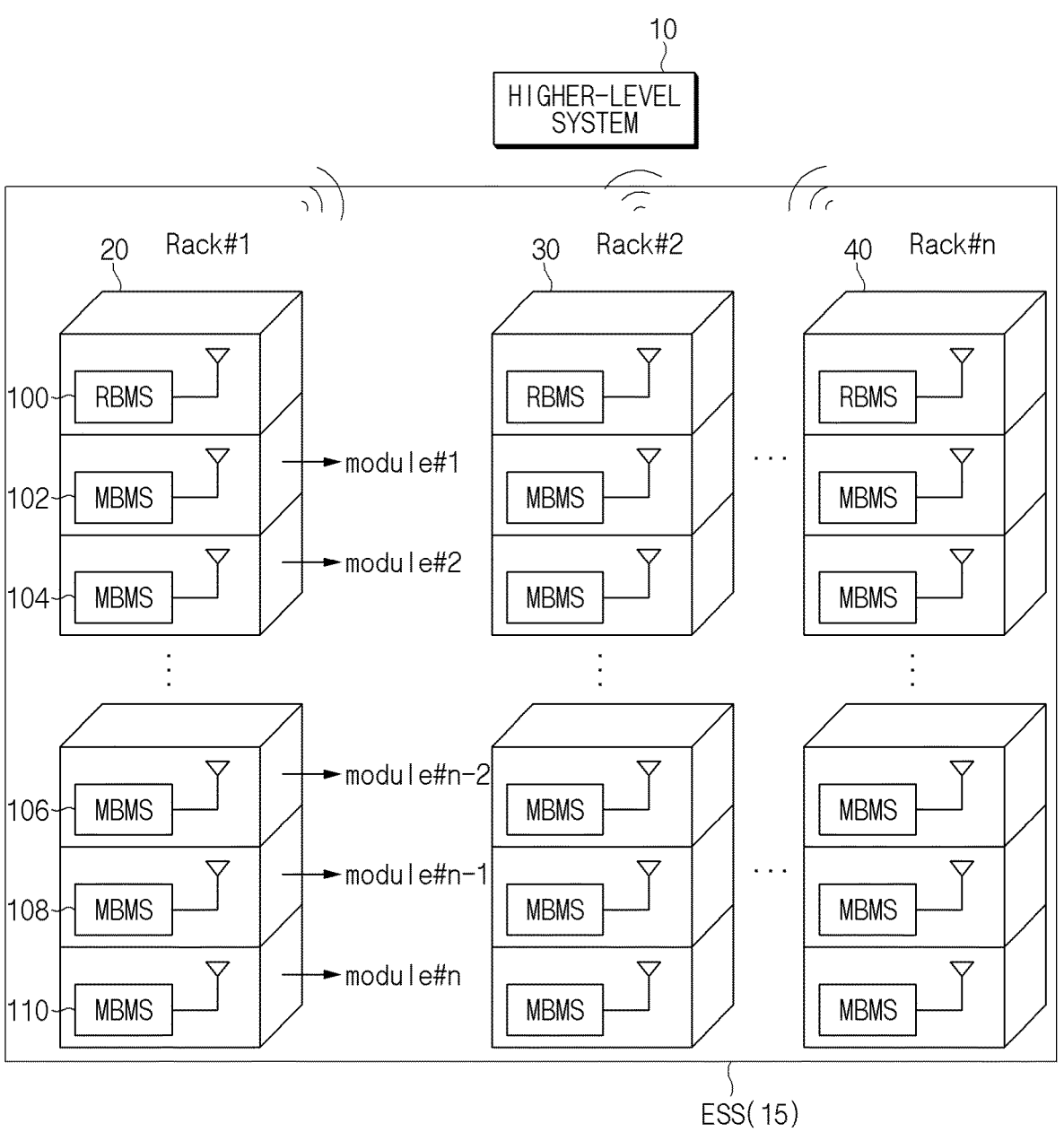
FIG. 1 schematically illustrates the configuration of a plurality of battery racks in an ESS according to an embodiment of the present invention.

Hereinafter, various embodiments of the present invention will be described with reference to the accompanying drawings. However, it should be understood that the present invention is not limited to a particular embodiment, but includes various modifications, equivalents, and/or alternatives of embodiments of the present invention. With respect to the description of the drawings, similar reference numerals may be used for similar components.

The terms used in this document are only used to describe specific embodiments, and may not be intended to limit the scope of other embodiments. Singular expressions may include plural expressions unless the context clearly indicates otherwise. All the terms used herein, including technical or scientific terms, may have the same meanings as those commonly understood by those skilled in the art of the present invention. Terms that are defined in a dictionary commonly used should be interpreted as having the same or similar meaning to the meaning in the context of the related art, and should not be interpreted as having an ideal or overly formal meaning unless explicitly defined in the present document. In some cases, even the terms defined in this document should not be interpreted as excluding the embodiments of the present invention.

In addition, in describing components of the embodiments of the present invention, terms such as first, second, A, B, (a), and (b) may be used. These terms are only intended to distinguish the components from other components, and are not to be construed as limiting the nature or order of the components of interest by the terms. When a component is described as being "connected", "coupled" or "connected" to another component, the component may be directly connected to or connected to the other component, but it should be understood that there may be another component between each component that may be "connected", "coupled" or "connected."

FIG. 1 schematically illustrates the configuration of a plurality of battery racks in an ESS according to an embodiment of the present invention.

An ESS 15 includes a plurality of battery racks 20, 30, and 40. Each of the battery racks includes a plurality of battery modules 100 to 110 connected in series or parallel.

Each of the battery modules 100 to 110 includes a battery management system (BMS) for controlling and monitoring the battery modules. The BMS includes module BMSs (MBMSs) for controlling and monitoring each of the battery modules and a rack BMS (RBMS) for controlling a plurality of MBMSs and transferring data received from the MBMSs to a higher-level system. In addition, the RBMSs may transmit a command received from the higher-level system to each of the battery modules or a corresponding battery module.

Each of the MBMSs monitors the state of a battery by sensing the temperature, voltage, current, and the like of each battery module or battery cell, and transmits the monitoring information data to the RBMS wirelessly or by wire.

The RBMS which has received battery state information or the state information data of a battery module from each MEMS may directly transmit the data to the higher-level system, or may transfer information data determining the state of the corresponding battery module on the basis of the data to the higher-level system.

Figure 2:
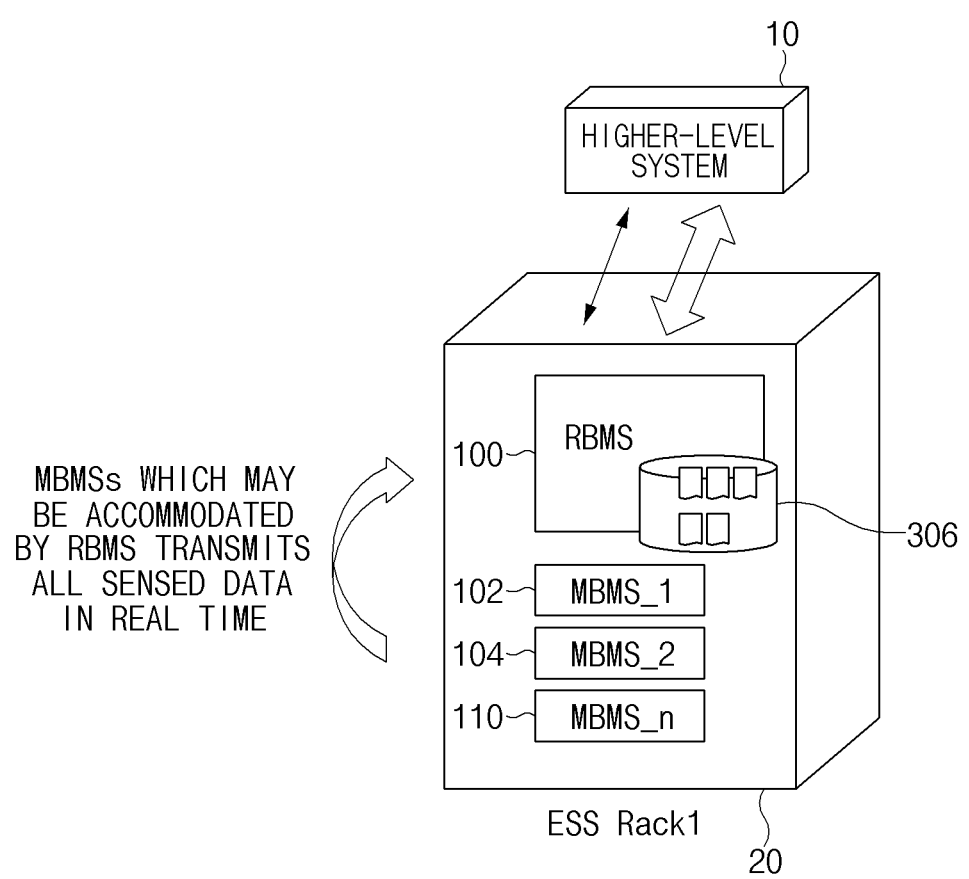
FIG. 2 illustrates a BMS system according to the present invention.

FIG. 2 illustrates a BMS system according to the present invention.

An ESS rack 20 includes a plurality of battery racks. Each of the battery racks includes a plurality of battery modules connected in series or parallel. Each of the battery modules is monitored and controlled by each module EMS.

FIG. 2 illustrates a rack BMS 100 (RBMS) for one battery rack included in the ESS rack 20 and a plurality of module BMS 102 to 110 (MEMS) communicating wirelessly with the corresponding RMBS 100.

Data is communicated wirelessly between the RBMS 100 and the MBMSs 102 to 110 in the ESS rack 20. Each of the MBMSs 102 to 110 transmits to the RBMS 100 data of voltage, current, and temperature measured in each battery module, and normal state information data or abnormality data (for example, information related to anomalies of a battery, including overvoltage conditions, low voltage conditions, and sudden temperature changes) among information data of the state of a battery diagnosed in each of the MBMSs 102 to 110. Alternatively, each of the MBMSs 102 to 110 transmits the state data of a fan attached to a battery module to the RBMS 100.

Alternatively, the RBMS 100 may receive a digital signal separately through a terminal. The digital signal received by the RBMS 100 may be an abnormality signal to be immediately transferred to the higher-level system, for example, a signal received directly from a molded case circuit breaker (MCCB) (circuit breaker) or a protection relay, a signal received directly from various sensors (door opening, overvoltage/overcurrent relay, etc.), and the like.

The RBMS 100 classifies data received from each of the MBMSs 102 to 110 into first data and second data based on preset criteria. When determined to be data related to anomalies of a battery or battery module, among the data received from the MBMSs 102 to 110, the data is classified into the first data (real-time data) based on the preset criteria. For example, the first data may be data to be transmitted to the higher-level system in real time from the RBMS 100, such as data of battery overvoltage, low voltage, terminal opening, sudden change in temperature of a battery over a preset value, or battery abnormality or danger signal data received from the MEMS, and the like. The criteria for setting as the first data may be preset.

The RBMS 100 classifies data among the data received from the MBMSs 102 to 110 into second data (time series data), if the data is determined to be data in which the order of occurrence of events is important or data which requires global time data. For example, if it is the data in which the order of occurrence of events is important or the global time data, battery cell voltage, temperature, battery module diagnostic data, and the like may be included.

In addition, the RBMS 100 classifies less urgent data among the data received from the MBMSs 102 to 110 into the second data in order to prioritize urgent data processing. For example, the less urgent data may include battery module self-diagnosis result data, AUX (fan state, door opening, etc.) sensing data, and the like. Meanwhile, the criteria for setting as the second data may also be preset.

Meanwhile, data received by the RBMS 100 may not be classified, and the first data may be based on the input of a separate digital signal. A digital signal to be converted into the first data may be, for example, a signal to be directly transferred to the higher-level system, for example, a signal received directly from an MCCB (circuit breaker) or a protection relay, and a signal received directly from various sensors (door opening, overvoltage/overcurrent relay, etc.).

The first data is transmitted to the higher-level system in real time in a CAN communication manner. However, the first data is analog data converted from a digital signal directly inputted. However, in the present invention, the transmission of the first data is not limited to the CAN communication method. In addition, various methods capable of real-time communication such as EtherCAT may be used.

The second data is stored in a second data storage unit 306. The second data may include a time stamp representing time measured as needed. The stored second data is transmitted in a block form to the higher-level system at a predetermined period, or transmitted in a block form to the higher-level system when a transmission request signal of the higher-level system is received.

The second data is transmitted to the higher-level system by streaming. In addition, the RBMS 100 may transmit the second data to the higher-level system, for example, using a User Datagram Protocol (UDP) or a Transmission Control Protocol (TCP) on the basis of Ethernet a having relatively high transmission speed, or a wi-fi. However, this is only an exemplary communication method. The communication method is not particularly limited. Any communication method capable of transmitting the stored second data in a block form to a higher-level system 10 by streaming together with the corresponding time stamp is fine.

In addition, in the present specification, the RBMS and the MEMS are exemplarily described, but any configuration is fine as long as it is a BMS which transmits data to a higher-level system and a slave BMS thereof.

Figure 3A:
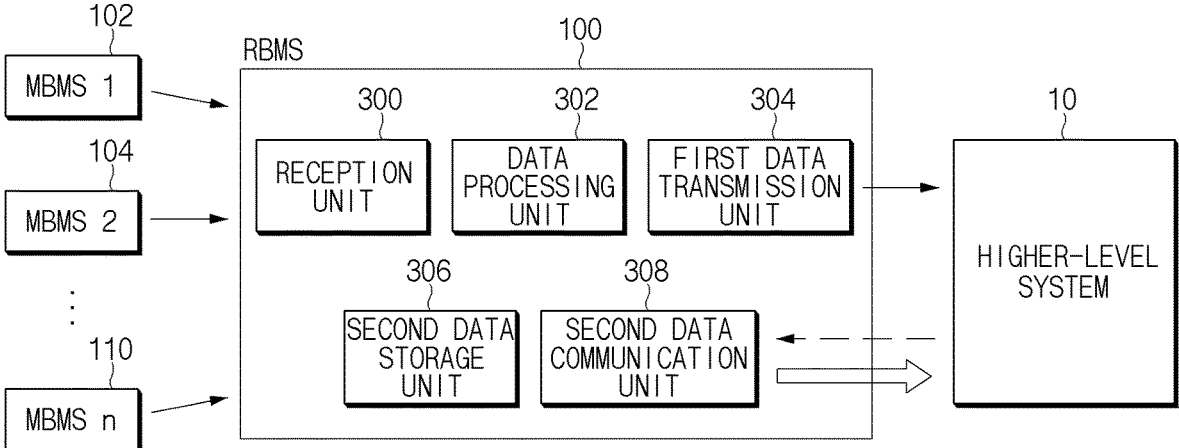
FIG. 3A illustrates a BMS system according to an embodiment of the present invention.

FIG. 3A illustrates a BMS system according to an embodiment of the present invention.

The RBMS 100 includes a reception unit 300, a data processing unit 302, a first data transmission unit 304, a second data storage unit 306, and a second data communication unit 308.

The reception unit 300 receives data in real time from the plurality of MBMSs 102 to 100. The received data may include data of voltage, current, and temperature measured in each battery module, and normal state information data or abnormality data (for example, information related to anomalies of a battery, including overvoltage conditions, low voltage conditions, and sudden temperature changes) among information data of the state of a battery diagnosed in each of the MBMSs 102 to 110. In addition, the received data may include all of state information related to a battery and a battery module, such as the state data of a fan attached to the battery module.

The data processing unit 302 receives data which the reception unit 300 has received in real time. The data processing unit 302 classifies the received data into the first data and the second data on the basis of the preset criteria.

The first data is data related to anomalies of a battery or anomalies of a battery module, which may be data to be immediately transmitted to a higher-level system. For example, the first data may be data to be transmitted to the higher-level system in real time from the RBMS 100, such as data of battery overvoltage, low voltage, terminal opening, sudden change in temperature of a battery over a preset value, or battery abnormality or danger signal data received from the MBMSs, and the like. The criteria for setting as the first data may be preset.

The second data may be data in which the order of occurrence of events is important or data which requires global time data among the data received from the MBMSs 102 to 110. For example, if it is the data in which the order of occurrence of events is important or the global time data, battery cell voltage, temperature, battery module diagnostic data, and the like may be included. In addition, the second data may include a time stamp representing time measured as needed.

In addition, the second data may be less urgent data among the data received from the MBMSs 102 to 110 in order to process urgent data. For example, the less urgent data may include battery module self-diagnosis result data, AUX (fan state, door opening, etc.) sensing data, and the like. Meanwhile, the criteria for setting as the second data may also be preset.

Data classified into the first data in the data processing unit 302 is transferred to the first data transmission unit 304. The first data transmission unit 304 transmits the first data to the higher-level system 10 in real time in the CAN communication method. At this time, the communication method of the first data transmission unit 304 may be the same as the data communication method of the typical higher-level system 10 in terms of interface, transmission method, transmission period, and the like.

Data classified into the second data in the data processing unit 302 is transferred to the second data storage unit 306.

The second data storage unit 306 stores the second data (can include a time stamp) received from the data processing unit 302. By storing the second data with the time stamp and transmitting the same by streaming as described above, it is possible to shorten communication time.

The second data communication unit 308 transmits the second data in a block form to the higher-level system 10 by streaming periodically or when a second data transmission request signal is received from the higher-level system 10. For example, the second data may be transmitted using a User Datagram Protocol (UDP) or a Transmission Control Protocol (TCP) on the basis of Ethernet a having relatively high transmission speed, or a wi-fi. However, this is only an exemplary communication method. The communication method is not particularly limited. Any communication method capable of transmitting the second data in a block form to the higher-level system 10 by streaming is fine.

Figure 3B:
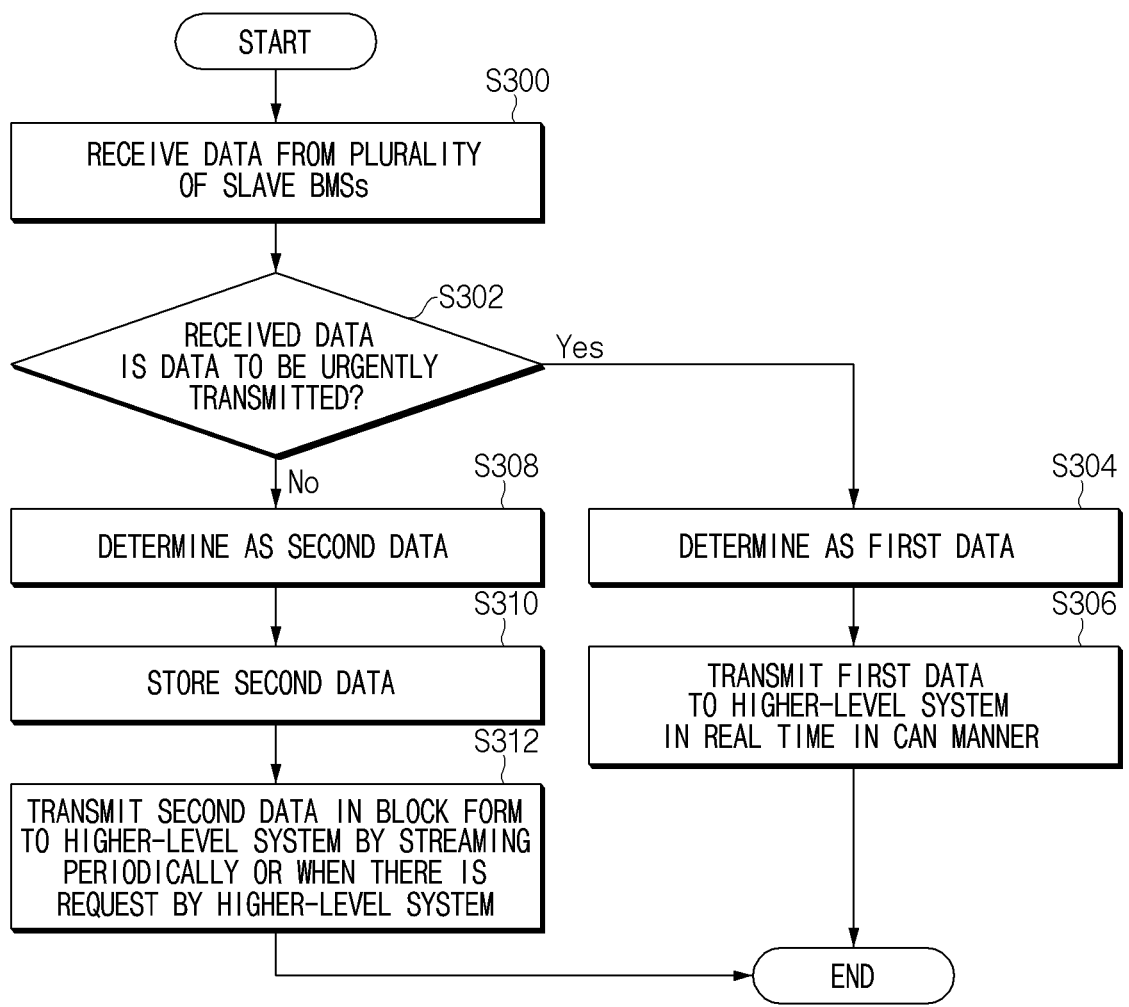
FIG. 3B illustrates a flowchart of a method for transmitting data to a higher-level system by BMSs according to an embodiment of the present invention.

FIG. 3B illustrates a flowchart of a method for transmitting data to a higher-level system by a BMS according to an embodiment of the present invention.

The reception unit 300 receives data in real time from to a plurality of slave BMSs 102 to 100 (S300). The received data may include data of voltage, current, and temperature measured in each battery module or battery cell, and normal state information data or abnormality data (for example, information related to anomalies of a battery, including overvoltage conditions, low voltage conditions, and sudden temperature changes) among information data of the state of a battery diagnosed in each of the MBMSs 102 to 110. In addition, the received data may include all of state information related to a battery and a battery module, such as the state data of a fan attached to the battery module.

The data processing unit 302 determines whether the received data is data to be urgently transmitted based on preset criteria (S302). The data processing unit 302 analyzes data received from the reception unit 300 to determine whether the received data is data to be urgently transmitted based on the preset criteria, for example, data of battery overvoltage, low voltage, terminal opening, sudden change in temperature of a battery over a preset value, or battery abnormality or danger signal data received from the MBMSs, and the like.

The data processing unit 302 determines the corresponding data to be first data when the received data is determined to be the data to be urgently transmitted based on the preset criteria (S304).

The data processing unit 302 transfers the data determined to be the first data to the first data transmission unit 304. The first data transmission unit 304 transmits the first data to the higher-level system 10 in real time in a CAN communication manner (S306).

When the received data is not the data to be urgently transmitted based on the preset criteria, the data processing unit 302 determines the same to be second data (S308).

The second data may be, for example, data in which the order of occurrence of events is important or data which requires global time data among the received data. For example, if it is the data in which the order of occurrence of events is important or the global time data, battery cell voltage, temperature, battery module diagnostic data, and the like may be included. In addition, the second data may include a time stamp representing time measured as needed.

In addition, the second data may be less urgent data among the data received from the MBMSs 102 to 110 in order to process urgent data. For example, the less urgent data may include battery module self-diagnosis result data, AUX (fan state, door opening, etc.) sensing data, and the like. Meanwhile, the criteria for setting as the second data may also be preset.

The data processing unit 302 transfers the data determined to be the second data to the second data storage unit 306 (S310).

The second data storage unit 306 which has received the second data stores the second data with a time stamp (S310). By storing the second data and transmitting the same in a block form by streaming as described above, it is possible to shorten communication time.

The second data is transmitted in block form to the higher-level system 10 by streaming when a transmission request signal is received from the higher-level system 10 or at a predetermined period (i.e., periodically) (S312).

For example, the second data may be transmitted using a User Datagram Protocol (UDP) or a Transmission Control Protocol (TCP) on the basis of Ethernet a having relatively high transmission speed, or a wi-fi. However, this is only an exemplary communication method. The communication method is not particularly limited. Any communication method capable of transmitting the second data stored in a block form to the higher-level system 10 by streaming is fine.

Figure 4:
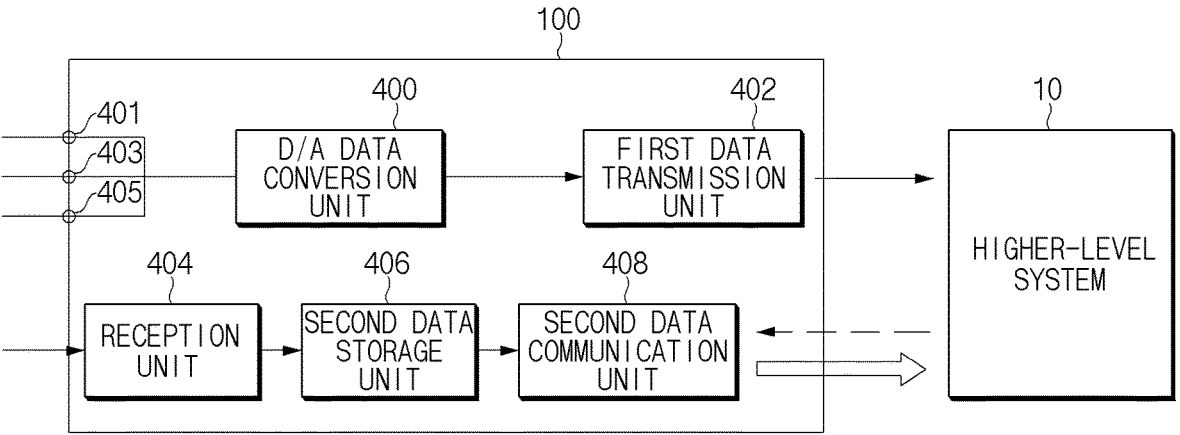
FIG. 4 illustrates a BMS system according to another embodiment of the present invention.

FIG. 4 illustrates a BMS system according to another embodiment of the present invention.

The RBMS 100 includes a plurality of terminals 401, 403, and 405, a digital/analog (D/A) data conversion unit 400, a first data transmission unit 402, a reception unit 404, a second data storage unit 406, and a second data communication unit 408.

A digital signal is received from the plurality of terminals 401, 403, and 405. The digital signal received by the RBMS 100 may be an abnormality signal to be immediately transferred to a higher-level system, for example, a signal received directly from an MCCB (circuit breaker) or a protection relay, a signal received directly from various sensors (door opening, overvoltage/overcurrent relay, etc.), and the like. In addition to the example, the digital signal may be received as a digital signal directly through a sensor, and all the information to be urgently transferred to the higher-level system 10 in real time, may be implemented in the present configuration. The digital signal directly received as described above is converted into analog and received by a pre-configured device as a signal to be transmitted to the higher-level system 10 in real time.

The D/A data conversion unit 400 converts the received digital signal into an analog signal. The digital signal received by the plurality of terminals is a signal to be transferred to a higher-level system in real time, and data obtained by converting the signal into analog data is first data.

The D/A data conversion unit 400 converts a digital signal into an analog signal, and then transmits the first data, which is the corresponding analog data, to the first data transmission unit 402.

The first data transmission unit 402 which has received the first data from the D/A data conversion unit 400 transmits the same to a higher-level system in real time in a CAN manner.

The reception unit 404 receives data from a plurality of MBMSs. The data received from the plurality of MBMSs may be data in which the order of occurrence of events is important or data which requires global time data, for example, battery cell voltage, temperature, battery module diagnostic data, and the like. The data received by the reception unit 404 may include a time stamp representing measured time.

In addition, the data received by the reception unit 404 may be less urgent data, which may include, for example, battery module self-diagnosis result data, AUX (fan state, door opening, etc.) sensing data, and the like. In addition to the example, data received by the reception unit 404 may be preset.

The data received by the reception unit 404 is transmitted to the second data storage unit 406 as second data.

The second data storage unit 406 stores the received second data with a time stamp. By storing the second data and transmitting the same in a block form by streaming as described above, it is possible to shorten communication time.

The second data communication unit 408 transmits the second data stored in a block form to the higher-level system by streaming periodically or when a second data transmission request signal is received from the higher-level system 10. For example, the second data may be transmitted using a User Datagram Protocol (UDP) or a Transmission Control Protocol (TCP) on the basis of Ethernet a having relatively high transmission speed, or a wi-fi. However, this is only an exemplary communication method. The communication method is not particularly limited. Any communication method capable of transmitting the second data stored in a block form to the higher-level system 10 by streaming is fine.

Figure 5:
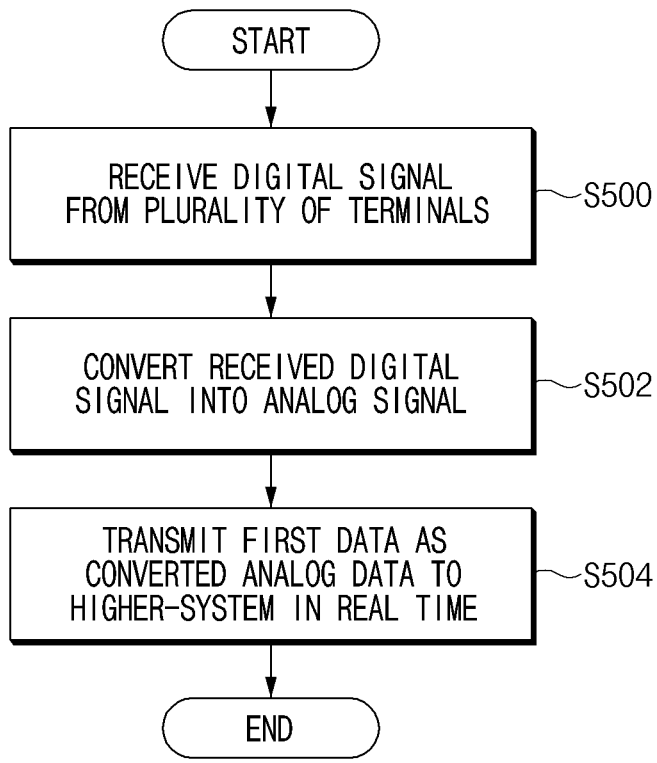
FIG. 5 illustrates a flowchart of a method for transmitting data to a higher-level system by BMSs according to another embodiment of the present invention.

FIG. 5 illustrates a flowchart of a method for transmitting data to a higher-level system by a BMS according to another embodiment of the present invention.

A digital signal is received from the plurality of terminals 401, 403, and 405 (S500). The digital signal received by the RBMS 100 may be an abnormality signal to be immediately transferred to a higher-level system, for example, a signal received directly from an MCCB (circuit breaker) or a protection relay, a signal received directly from various sensors (door opening, overvoltage/overcurrent relay, etc.), and the like. In addition to the example, the digital signal may be received as a digital signal directly through a sensor, and all the information to be urgently transferred to the higher-level system 10 in real time, may be implemented in the present configuration. The digital signal directly received as described above is converted into analog and received by a pre-configured device as a signal to be transmitted to the higher-level system 10 in real time.

The D/A conversion unit 400 converts the received digital signal into an analog signal (S502). The digital signal received by the plurality of terminals is a signal to be transferred to a higher-level system in real time, and data converted into analog data is first data.

The D/A data conversion unit 400 converts a digital signal into an analog signal, and then transmits the first data, which is data of the corresponding analog signal, to the first data transmission unit 402.

The first data transmission unit 402 which has received the first data from the D/A data conversion unit 400 transmits the same to the higher-level system 10 in real time (S504). At this time, the first data transmission unit 402 may transmit the first data to the higher-level system 10 in real time in a CAN manner.

Figure 6:
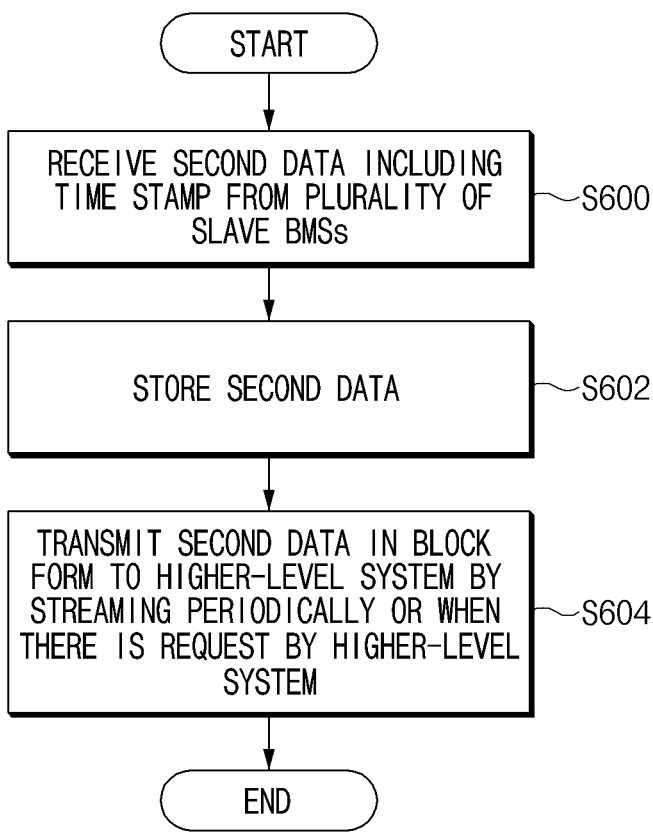
FIG. 6 illustrates a flowchart of a method for transmitting data to a higher-level system by BMSs according to another embodiment of the present invention.

FIG. 6 illustrates a flowchart of a method for transmitting data to a higher-level system by a EMS according to another embodiment of the present invention.

The reception unit 404 receives data from the plurality of MBMSs (S600). The data received from the plurality of MBMSs may be data in which the order of occurrence of events is important or data which requires global time data, for example, battery cell voltage, temperature, battery module diagnostic data, and the like. The second data may include, for example, a time stamp representing measured time.

In addition, the data received by the reception unit 404 may be less urgent data, which may include, for example, battery module self-diagnosis result data, AUX (fan state, door opening, etc.) sensing data, and the like. In addition to the example, data received by the reception unit 404 may be preset.

The data received by the reception unit 404 is transmitted to the second data storage unit 406 as second data.

The second data storage unit 406 stores the received second data with the time stamp (S602). By storing the second data and transmitting the same in a block form by streaming as described above, it is possible to shorten communication time.

The second data communication unit 408 transmits the stored second data to the higher-level system 10 by streaming in a block form periodically or when a second data transmission request signal is received from the higher-level system 10 (S604). For example, the second data may be transmitted using a User Datagram Protocol (UDP) or a Transmission Control Protocol (TCP) on the basis of Ethernet a having relatively high transmission speed, or a wi-fi. However, this is only an exemplary communication method. The communication method is not particularly limited. Any communication method capable of transmitting the second data stored in a block form to the higher-level system 10 by streaming is fine.

Figure 7:
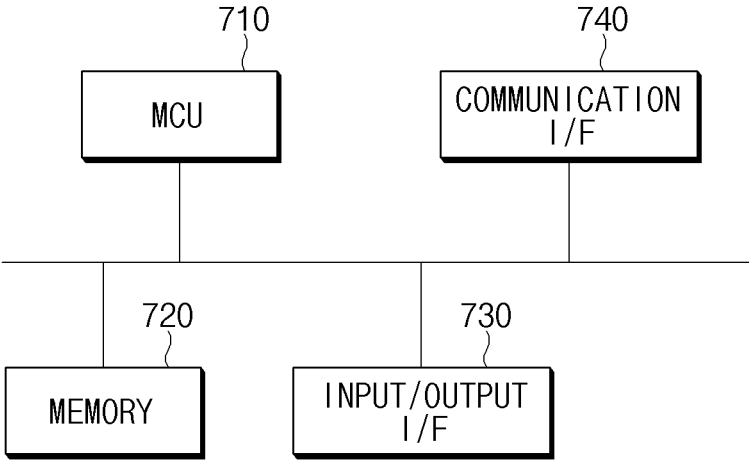
FIG. 7 is a block diagram illustrating a hardware configuration of a battery management system according to an embodiment of the present invention.

FIG. 7 is a block diagram illustrating a hardware configuration of a battery management system according to an embodiment of the present invention.

The battery management system may be provided with a micro-controller (MCU) 710 for controlling various processing and each component, a memory 720 in which an operating system program and various programs (for example, a battery pack abnormality diagnosis program or a battery pack temperature estimation program) are recorded, an input/output interface 730 for providing an input interface and an output interface between a battery cell module and/or a semiconductor switching device, and a communication interface 740 capable of communicating with the outside through a wired/wireless communication network. As such, a computer program according to the present invention is recorded in the memory 720 and processed by the micro-controller 720, and thus, may be implemented as, for example, a module for performing each functional block illustrated in FIG. 3a and FIG. 4.

In the present specification, "an embodiment" of principles of the present invention and the reference to various variants of such a representation mean certain features, structures, characteristics, etc. are included in at least one embodiment of the principles of the present invention in connection with this embodiment. Therefore, the representation "in an embodiment" and any other variant examples disclosed throughout the present specification are not necessarily all referring to the same embodiment.

All of the embodiments and conditional examples disclosed through the present specification have been described with the intention of helping those skilled in the art to understand the principles and concepts of the present invention, and it will be understood by those skilled in the art that the present invention may be implemented in a modified form without departing from the essential characteristics of the present invention. Thus, the disclosed embodiments should be considered from a descriptive point of view, not from a limited point of view. The scope of the present invention is shown in the claims rather than the foregoing description, and all differences within the equivalent range should be interpreted as being included in the present invention.

The invention claimed is:

1. A battery management system (BMS) comprising:
memory; and
a micro-controller (MCU), the micro-controller configured to:
classify data received in real time from a plurality of slave BMSs to be first data when the data is determined to be data to be urgently transmitted based on preset criteria and classify the received data to be second data when the data is determined not to be urgently transmitted,
transmit the first data to a higher-level system using a wireless first communication protocol by a first data transmitter,
store, in the memory, the second data cumulatively, and
transmit the second data stored in the memory to the higher-level system using a wireless second communication protocol different from the wireless first communication protocol by a second data transmitter,
wherein the wireless first communication protocol is to transmit the received data in a Controller Area Network (CAN) manner, and transmit the second data in a block form using a User Datagram Protocol (UDP) or a Transmission Control Protocol (TCP) to the higher-level system periodically or when a transmission request is received from the higher-level system,
wherein the first data is data that is converted from a digital signal to analog data, the first data transmitter being configured to transmit the analog data,
wherein the first data includes data transmitted directly from a protection relay in a form of the digital signal, the digital signal relating to an overvoltage of the protection relay,
wherein the plurality of slave BMSs are configured to wirelessly communicate with the MCU,
wherein the second data includes battery module self-diagnosis result data, and
wherein the MCU is further configured to determine corresponding data to be the data to be urgently transmitted, and classify the received data as the first data when the data received from the plurality of slave BMSs is determined to be data related to a change in temperature of a battery over a preset value.

2. The BMS of claim 1, wherein the wireless second communication protocol is to transmit the second data in a streaming manner.

3. The BMS of claim 1, wherein the memory stores the second data together with a time stamp which has been received together with the second data.

4. The BMS of claim 1, wherein the MCU is further configured to:
determine the corresponding data to be the data to be urgently transmitted, and classify the received data as the first data, when the data received from the plurality of slave BMSs is determined to be abnormal data or to be data related to at least one of overvoltage, low voltage, and a terminal opening, and
classify the corresponding data as the second data, when the data received from the plurality of slave BMSs is determined to be data related to at least one of battery cell voltage, temperature or diagnostic data, and fan state data.

5. The BMS of claim 1, wherein the BMS is a BMS for an energy storage system (ESS).

6. The BMS of claim 1, wherein the MCU comprises a data processing unit configured to classify the data received in real time from the plurality of slave BMSs and directly transmit the first data to the first data transmitter and the second data to the second data transmitter.

7. The BMS of claim 1, wherein the second data includes auxiliary sensing data including state data of a fan.

8. A battery management system (BMS) comprising:

memory; and a micro-controller (MCU), the micro-controller configured to:

receive a digital signal from a plurality of terminals and convert the digital signal into analog data, receive the analog data and transmit the analog data to a higher-level system using a wireless first communication protocol by a first data transmitter, receive second data from a plurality of slave BMSs, store, in the memory, the second data cumulatively, and transmit the second data stored in the memory to the higher-level system using a wireless second communication protocol different from the wireless first communication protocol by a second data transmitter, wherein the wireless first communication protocol is to transmit the analog data in a Controller Area Network (CAN) manner, and transmit the second data in a block form using a User Datagram Protocol (UDP) or a Transmission Control Protocol (TCP) to the higher-level system periodically or when a transmission request is received from the higher-level system, wherein first data includes data transmitted directly from a protection relay in a form of the digital signal, the digital signal relating to an overvoltage of the protection relay, wherein the plurality of slave BMSs are configured to wirelessly communicate with the MCU, wherein the second data includes battery module self-diagnosis result data, and wherein the MCU is further configured to determine the analog data to be data to be urgently transmitted, and classify the received analog data as the first data when the data received from the plurality of terminals is determined to be data related to a change in temperature of a battery over a preset value.

9. The BMS of claim 8, wherein the wireless second communication protocol is to transmit the second data in a streaming manner.

10. The BMS of claim 8, wherein the memory stores the second data together with a time stamp which has been received together with the second data.

11. The BMS of claim 8, wherein the digital signal includes data related to signal data received directly from a molded case circuit breaker (MCCB), and signal data received directly from at least one sensor, and the second data is data related to at least one of battery cell voltage, temperature or diagnostic data, and fan state data.

12. The BMS of claim 8, wherein the BMS is for an energy storage system (ESS).

13. A method for transmitting data to a higher-level system, the method performed by a battery management system (BMS), the BMS including a micro-controller (MCU), and the method comprising:

determining whether data received from a slave BMS is to be urgently transmitted based on preset criteria;

determining, when the data received from the slave BMS is determined to be urgently transmitted based on the preset criteria, the received data to be first data, and transmitting the first data to the higher-level system using a wireless first communication protocol by a first data transmitter;

determining, when the data received from the slave BMS is determined not to be urgently transmitted based on the preset criteria, the received data to be second data, and storing the second data; and transmitting the stored second data to the higher-level system using a wireless second communication protocol by a second data transmitter, wherein the wireless first communication protocol is to transmit the first data in a Controller Area Network (CAN) manner, and the second data is transmitted in a block form using a User Datagram Protocol (UDP) or a Transmission Control Protocol (TCP) to the higher-level system periodically or when a transmission request is received from the higher-level system, wherein the first data is data that is converted from a digital signal to analog data, the first data transmitter being configured to transmit the analog data, wherein the first data includes data transmitted directly from a protection relay in a form of the digital signal, the digital signal relating to an overvoltage of the protection relay, wherein the slave BMS is configured to wirelessly communicate with the MCU, wherein the second data includes battery module self-diagnosis result data, and wherein the determining, when the data received from the slave BMS is determined to be urgently transmitted based on the preset criteria, the received data to be first data, includes the data received from the slave BMS is determined to be data related to a change in temperature of a battery over a preset value.

14. The method of claim 13, wherein the wireless second communication protocol is to transmit the second data in a streaming manner.

15. The method of claim 13, wherein when the data received from the slave BMS is determined to be data to be urgently transmitted based on the preset criteria, the data received from the slave BMS is determined to be abnormal data or data related to at least one of overvoltage, low voltage, and a terminal opening.

16. The method of claim 13, wherein the method for transmitting data to the higher-level system is performed by the BMS for an energy storage system (ESS).

\* \* \* \* \*